US010176988B2

(12) United States Patent
Horiike et al.

(10) Patent No.: US 10,176,988 B2
(45) Date of Patent: Jan. 8, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Ryota Horiike, Toyama (JP); Kenji Kameda, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 14 days.

(21) Appl. No.: 15/631,371

(22) Filed: Jun. 23, 2017

(65) Prior Publication Data
US 2017/0372890 A1 Dec. 28, 2017

(30) Foreign Application Priority Data

Jun. 23, 2016 (JP) .................. 2016-124828

(51) Int. Cl.
H01L 21/02 (2006.01)
C23C 16/44 (2006.01)
C23C 16/52 (2006.01)
(52) U.S. Cl.
CPC ...... H01L 21/0262 (2013.01); C23C 16/4412 (2013.01); C23C 16/52 (2013.01)

(58) Field of Classification Search
CPC .. H01L 21/0262; C23C 16/4412; C23C 16/52
USPC ......................................... 438/478
See application file for complete search history.

(56) References Cited

U.S. PATENT DOCUMENTS

2015/0132972 A1* 5/2015 Wada .................. C23C 16/4401
438/778

FOREIGN PATENT DOCUMENTS

JP       2012-069844 A    4/2012

* cited by examiner

Primary Examiner — Anthony Ho
(74) Attorney, Agent, or Firm — Volpe and Koenig, P.C.

(57) ABSTRACT

A method of manufacturing a semiconductor device includes forming a film on a substrate by performing a cycle a predetermined number of times. The cycle includes: supplying a precursor to the substrate in a process chamber and exhausting the precursor from a first exhaust system; and supplying a reactant to the substrate in the process chamber and exhausting the reactant from a second exhaust system. In the forming of the film, when the precursor does not flow through the first exhaust system, a deactivator that is a material different from the reactant is directly supplied from a supply port provided in the first exhaust system into the first exhaust system.

14 Claims, 8 Drawing Sheets

FIG. 8
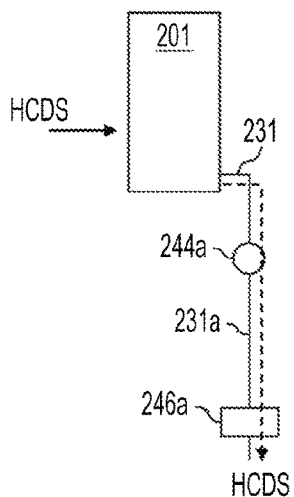
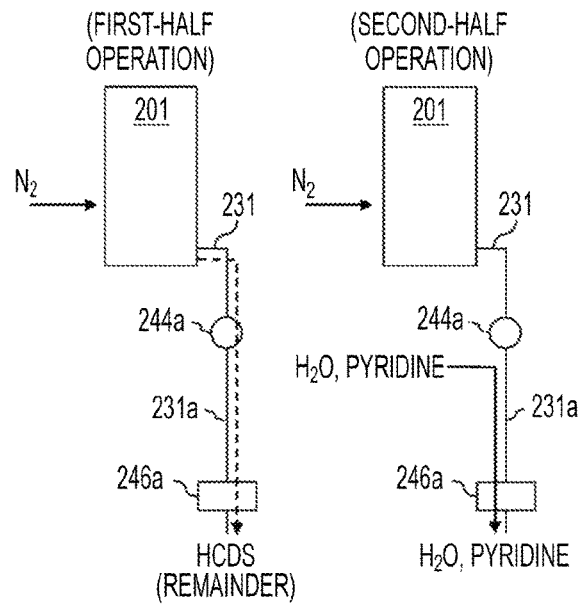
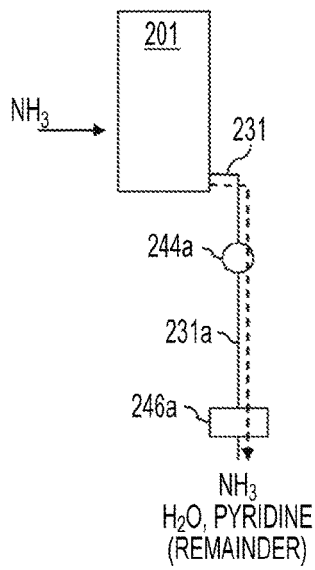
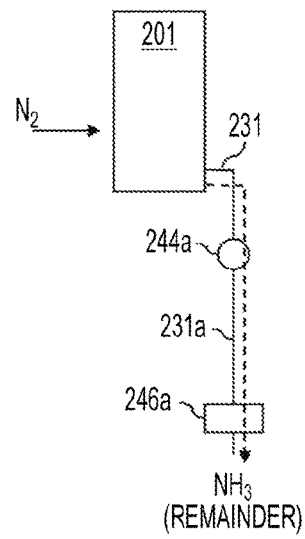

METHOD OF MANUFACTURING SEMICONDUCTOR DEVICE, SUBSTRATE PROCESSING APPARATUS, AND RECORDING MEDIUM

BACKGROUND

Technical Field

The present invention relates to a method of manufacturing a semiconductor device, a substrate processing apparatus, and a recording medium.

Related Art

As one of the processes of manufacturing a semiconductor device, a film-forming process including a process of supplying a precursor and a reactant to a substrate in a process chamber and exhausting the precursor and the reactant from an exhaust system may be performed. When a predetermined amount of an extraneous matter is deposited in the exhaust system by the film-forming process, the maintenance of the exhaust system is performed at a predetermined timing (see, for example, JP 2012-069844 A).

SUMMARY

It is an object of the present invention to provide a technology that is capable of reducing a maintenance frequency of an exhaust system.

According to an aspect of the present invention, there is provided a technique including forming a film on a substrate by performing a cycle a predetermined number of times, the cycle including:

supplying a precursor to the substrate in a process chamber and exhausting the precursor from a first exhaust system; and supplying a reactant to the substrate in the process chamber and exhausting the reactant from a second exhaust system, wherein, in the forming of the film, when the precursor does not flow through the first exhaust system, a deactivator that is a material different from the reactant is directly supplied from a supply port provided in the first exhaust system into the first exhaust system.

According to the present invention, it is possible to reduce a maintenance frequency of an exhaust system.

BRIEF DESCRIPTION OF DRAWINGS

FIG. 8 is a diagram illustrating an operation of an exhaust system according to another embodiment of the present invention.

DETAILED DESCRIPTION

Embodiment of Present Invention

Hereinafter, an embodiment of the present invention will be described with reference to FIGS. 1 to 3.

(1) Configuration of Substrate Processing Apparatus

Figure 1:
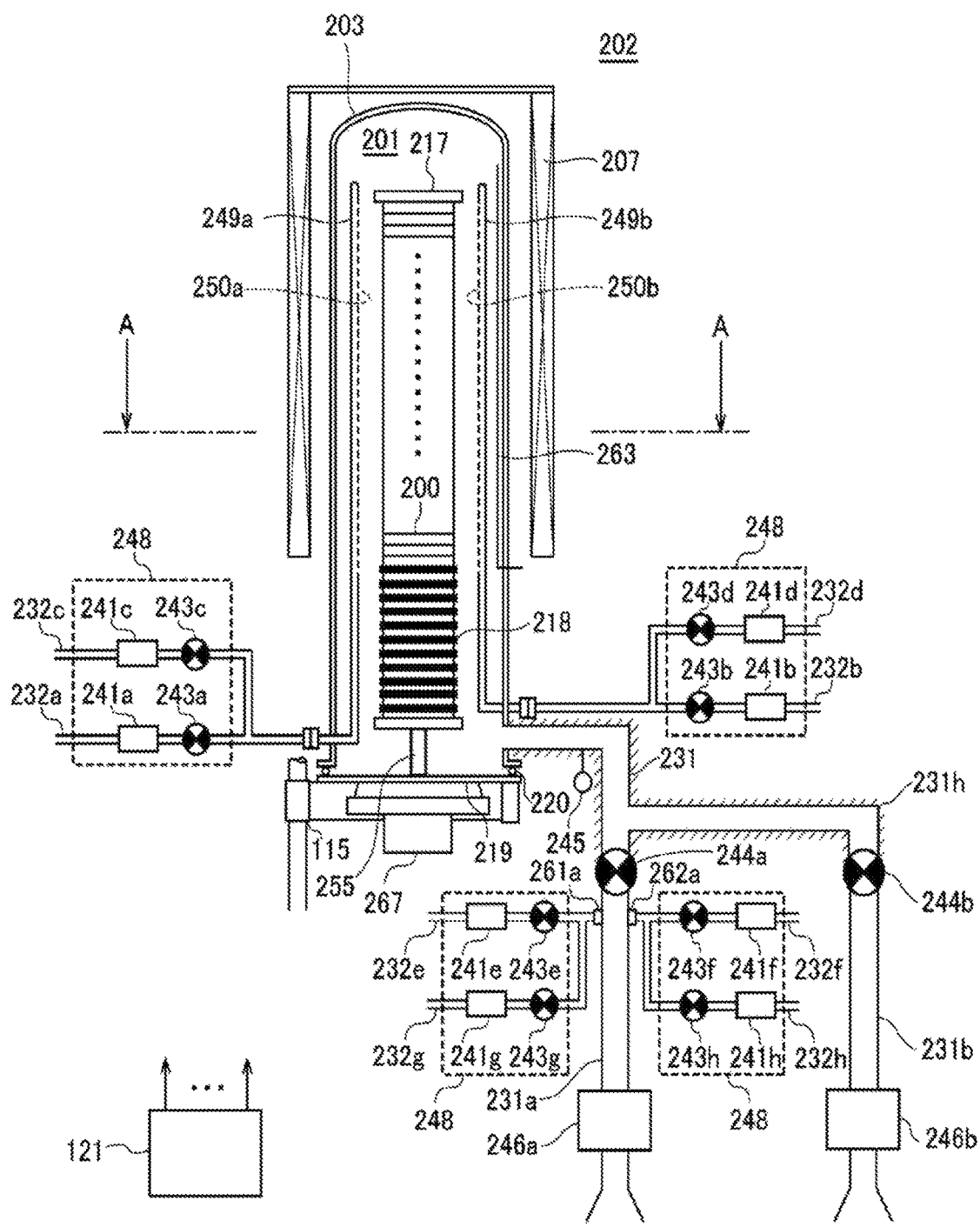
FIG. 1 is a schematic configuration diagram of a vertical process furnace of a substrate processing apparatus suitably used in an embodiment of the present invention and a longitudinal sectional view of a process furnace part.

As illustrated in FIG. 1, a process furnace 202 includes a heater 207 serving as a heating means (heating mechanism). The heater 207 has a cylindrical shape and is supported to a holding plate so that the heater 207 is vertically installed. The heater 207 functions as an activation mechanism (excitation unit) that activates (excites) a gas by heat.

Inside the heater 207, a reaction tube 203 is disposed to constitute a reaction vessel (process vessel) that is concentric with the heater 207. The reaction tube 203 is made of a heat resistant material, such as quartz ($SiO_2$) or silicon carbide (SiC), and is formed to have a cylindrical shape with a closed upper end and an opened lower end. A process chamber 201 is formed in a cylindrical hollow part of the reaction tube 203. The process chamber 201 is configured such that wafers 200 as substrates are accommodated.

In the process chamber 201, nozzles 249a and 249b are provided to pass through a lower sidewall of the reaction tube 203. Gas supply pipes 232a and 232b are respectively connected to the nozzles 249a and 249b.

Mass flow controllers (MFCs) 241a and 241b serving as flow rate controllers (flow rate control units) and valves 243a and 243b serving as on-off valves are respectively provided in the gas supply pipes 232a and 232b in this order from an upstream direction. Gas supply pipes 232c and 232d configured to supply an inert gas are respectively connected to downstream sides of the valves 243a and 243b of the gas supply pipes 232a and 232b. MFCs 241c and 241d and valves 243c and 243d are respectively provided in the gas supply pipes 232c and 232d in this order from the upstream direction.

Figure 2:
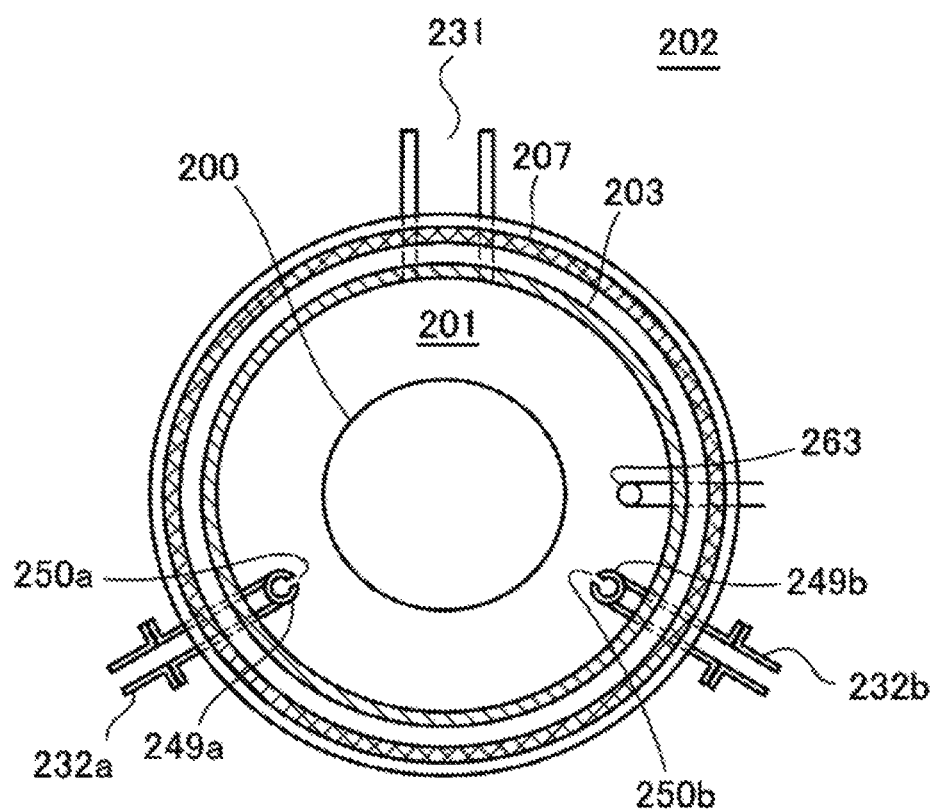
FIG. 2 is a schematic configuration diagram of the vertical process furnace of the substrate processing apparatus suitably used in the embodiment of the present invention and a sectional view of the process furnace part, taken along line A-A of FIG. 1.

As illustrated in FIG. 2, the nozzles 249a and 249b are respectively provided in an annular space between an inner wall of the reaction tube 203 and the wafers 200, when seen in a plan view, so as to rise upward in an arrangement direction of the wafers 200, extending from a lower part to an upper part of the inner wall of the reaction tube 203. That is, the nozzles 249a and 249b are respectively provided in a region horizontally surrounding a wafer arrangement region, at a side of the wafer arrangement region in which the wafers 200 are arranged, so as to extend along the wafer arrangement region. Gas supply holes 250a and 250b configured to supply a gas are respectively provided on side surfaces of the nozzles 249a and 249b. The gas supply holes 250a and 250b are respectively opened to face the center of the reaction tube 203, so that the gas is supplied toward the wafers 200. The gas supply holes 250a and 250b are plurally provided from the lower part to the upper part of the reaction tube 203.

As a precursor, a halogen-based precursor gas containing a specific element (main element) and a halogen element is supplied from the gas supply pipe 232a into the process chamber 201 through the MFC 241a, the valve 243a, and the nozzle 249a. The precursor gas is a precursor of a gaseous state, for example, a gas obtained by vaporizing a precursor that is a liquid state under normal temperature and normal pressure, or a precursor that is a gaseous state under normal temperature and normal pressure. The halogen element includes chlorine (Cl), fluorine (F), bromine (Br), and iodine (I). That is, the halogen-based precursor gas includes a halogen group such as a chloro group, a fluoro group, a bromo group, an iodine group, and the like. As the halogen-based precursor gas, for example, a halosilane precursor gas containing silicon (Si) and Cl as a specific element, that is, a chlorosilane precursor gas, can be used. As the chlorosilane precursor gas, for example, hexachlorodisilane ($Si_2Cl_6$, abbreviated to HCDS) gas can be used.

As a reactant, a nitrogen (N)-containing gas (nitriding gas, nitriding agent) is supplied from the gas supply pipe 232b into the process chamber 201 through the MFC 241b, the valve 243b, and the nozzle 249b. As the nitriding agent, for example, a hydrogen nitride-based gas can be used, and for example, ammonia ($NH_3$) gas can be used.

An inert gas is supplied from the gas supply pipes 232c and 232d into the process chamber 201 through the MFCs 241c and 241d, the valves 243c and 243d, the gas supply pipes 232a and 232b, and the nozzles 249a and 249b. As the inert gas, for example, nitrogen ($N_2$) gas can be used.

A precursor supply system (halosilane precursor supply system) is configured by, mainly, the gas supply pipe 232a, the MFC 241a, and the valve 243a. A reactant supply system (nitriding agent supply system) is configured by, mainly, the gas supply pipe 232b, the MFC 241b, and the valve 243b. An inert gas supply system is configured by, mainly, the gas supply pipes 232c and 232d, the MFCs 241c and 241d, and the valves 243c and 243d.

An exhaust pipe 231 is provided in the reaction tube 203 so as to exhaust the atmosphere of the process chamber 201. A pressure sensor 245 serving as a pressure detector (pressure detection unit) configured to detect a pressure in the process chamber 201 is provided on the upstream side of the exhaust pipe 231. The downstream side of the exhaust pipe 231 is branched into exhaust pipes 231a and 231b. Auto pressure controller (APC) valves 244a and 244b serving as pressure regulators (pressure regulation units) and vacuum pumps 246a and 246b serving as vacuum exhaust devices are respectively provided in the exhaust pipes 231a and 231b. The APC valves 244a and 244b are configured to perform a vacuum exhaust or a vacuum exhaust stop with respect to the process chamber 201 by opening or closing the valves while the vacuum pumps 246a and 246b are operating, and to regulate the pressure in the process chamber 201 by adjusting the degree of valve opening based on pressure information detected by the pressure sensor 245 while the vacuum pumps 246a and 246b are operating. As illustrated by hatching in FIG. 1, in the periphery of the exhaust pipe 231 and the periphery of the exhaust pipes 231a and 231b on the upstream side of the APC valves 244a and 244b, for example, a ribbon-shaped heater 231h severing as a heating means (heating mechanism) for heating them is wound, respectively.

A first exhaust system is configured by, mainly, the exhaust pipe 231, the exhaust pipe 231a, and the APC valve 244a. The vacuum pump 246a may be included in the first exhaust system. A second exhaust system is configured by, mainly, the exhaust pipe 231, the exhaust pipe 231b, and the APC valve 244b. The vacuum pump 246b may be included in the second exhaust system. Either or both of the first exhaust system and the second exhaust system can be referred to as an exhaust system. The pressure sensor 245 and the heater 231h may be included in the exhaust system. As described below, the first exhaust system and the second exhaust system are used while being alternately switched. That is, the first exhaust system is used when an atmosphere including a precursor is exhausted from the process chamber 201, and the second exhaust system is used when an atmosphere including a reactant is exhausted from the process chamber 201.

Supply ports 261a and 262a capable of directly supplying a gas into the exhaust pipe 231a are provided on the downstream side of the APC valve 244a of the exhaust pipe 231a. Gas supply pipes 232e to 232f are respectively connected to the supply ports 261a and 262a. MFCs 241e and 241f and valves 243e and 243f are respectively provided in the gas supply pipes 232e and 232f in this order from the upstream direction. Gas supply pipes 232g and 232h configured to supply an inert gas are respectively connected to downstream sides of the valves 243e and 243f of the gas supply pipes 232e and 232f. MFCs 241g and 241h and valves 243g and 243h are respectively provided in the gas supply pipes 232g and 232h in this order from the upstream direction.

As a deactivator that is a material different from the reactant, an oxygen (O)-containing gas (oxidizing gas, oxidizing agent) is supplied from the gas supply pipe 232e into the exhaust pipe 231a through the MFC 241e, the valve 243e, and the supply port 261a. The oxidizing agent acts as a reforming gas (deactivation promotion gas) to deactivate (oxidize) a precursor remaining in the exhaust pipe 231a to change an activated (unstable) state to a deactivated (stable) state. As the oxidizing agent, for example, a water vapor ($H_2O$ gas) containing an O—H bond, that is, a hydroxyl group, can be used.

A catalyst is supplied from the gas supply pipe 232f into the exhaust pipe 231a through the MFC 241f, the valve 243f, and the supply port 262a. The catalyst itself cannot perform an oxidation action, but if the catalyst is supplied into the exhaust pipe 231a together with the above-described oxidizing agent, the catalyst acts to promote an oxidation reaction, that is, a deactivation of a precursor remaining in the exhaust pipe 231a. Therefore, the catalyst can be considered to be included in the deactivator, like the oxidizing agent. As the catalyst, for example, pyridine ($C_5H_5N$) gas that is an amine-based gas containing C, N, and H can be used. A molecular structure of the catalyst may be partially decomposed in the process of the above-described oxidation reaction. As such, a material that partially changes before and after a chemical reaction is not strictly a "catalyst". However, in the present specification, even in a case where a material is partially decomposed in the process of a chemical reaction, a material that is not mostly decomposed and substantially acts as a catalyst by changing a reaction rate is referred to as a "catalyst".

An inert gas is supplied from the gas supply pipes 232g and 232h into the exhaust pipe 231a through the MFCs 241g and 241h, the valves 243g and 243h, the gas supply pipes 232e and 232f, and the supply ports 261a and 262a. As the inert gas, for example, $N_2$ gas can be used.

An oxidizing agent supply system is configured by, mainly, the gas supply pipe 232e, the MFC 241e, and the valve 243e. A catalyst supply system is configured by, mainly, the gas supply pipe 232f, the MFC 241f, and the valve 243f. A deactivator supply system is configured by, mainly, the oxidizing agent supply system and the catalyst supply system. An inert gas supply system is configured by, mainly, the gas supply pipes 232g and 232h, the MFCs 241g and 241h, and the valves 243g and 243h.

One or all of the various supply systems (the precursor supply system, the reactant supply system, the deactivator supply system, and the inert gas supply system) described above may be configured as an integrated supply system 248 in which the valves 243a to 243h, the MFCs 241 to 241h, and the like are integrated. The integrated supply system 248 is connected to each of the gas supply pipes 232a to 232h and is configured such that the operations of supplying various gases into the gas supply pipes 232a to 232h, that is, the operations of opening and closing the valves 243a to 243h, or the operations of adjusting the flow rates by the MFCs 241a to 241h are controlled by a controller 121 described later. The integrated supply system 248 is configured as an integration-type or division-type integrated unit, and it is possible to perform attachment and detachment with respect to the gas supply pipes 232a to 232h or the like on an integrated unit basis, and it is possible to perform maintenance, replacement, expansion, or the like of the supply system on an integrated unit basis.

Under the reaction tube 203, a seal cap 219 is provided as a furnace throat lid that can airtightly close a lower end opening of the reaction tube 203. The seal cap 219 is made of a metal such as stainless steel (SUS) and is formed to have a disk shape. On the top surface of the seal cap 219, an O-ring 220 is provided as a seal member that abuts against the lower end of the reaction tube 203. A rotation mechanism 267 that rotates a boat 217 described below is installed under the seal cap 219. A rotational shaft 255 of the rotation mechanism 267 passes through the seal cap 219 and is connected to the boat 217. The rotation mechanism 267 is configured to rotate the wafers 200 by rotating the boat 217. The seal cap 219 is configured such that the seal cap 219 is vertically moved upward and downward by a boat elevator 115 serving as an elevation mechanism installed outside the reaction tube 203. The boat elevator 115 is configured as a transfer device (transfer mechanism) that loads the boat 217 (that is, the wafers 200) into the process chamber 201 or unloads (transfers) the boat 217 (that is, the wafers 200) from the process chamber 201 by moving the seal cap 219 upward or downward.

The boat 217 serving as a substrate support is configured such that a plurality of sheets of wafers 200, for example, 25 to 200 wafers, are vertically aligned and supported in a horizontal posture, with their centers aligned with one another, in multiple stages, that is, arranged spaced apart from one another at predetermined intervals. The boat 217 is made of, for example, a heat resistant material such as quartz or SiC. Under the boat 217, a heat insulation plate 218, which is made of, for example, a heat resistant material such as quartz or SiC, is configured to be supported in a horizontal posture in multiple stages.

A temperature sensor 263 serving as a temperature detector is installed in the reaction tube 203. An amount of current to be supplied to the heater 207 is adjusted based on temperature information detected by the temperature sensor 263, so that the temperature in the process chamber 201 has a desired temperature distribution. The temperature sensor 263 is provided along the inner wall of the reaction tube 203.

Figure 3:
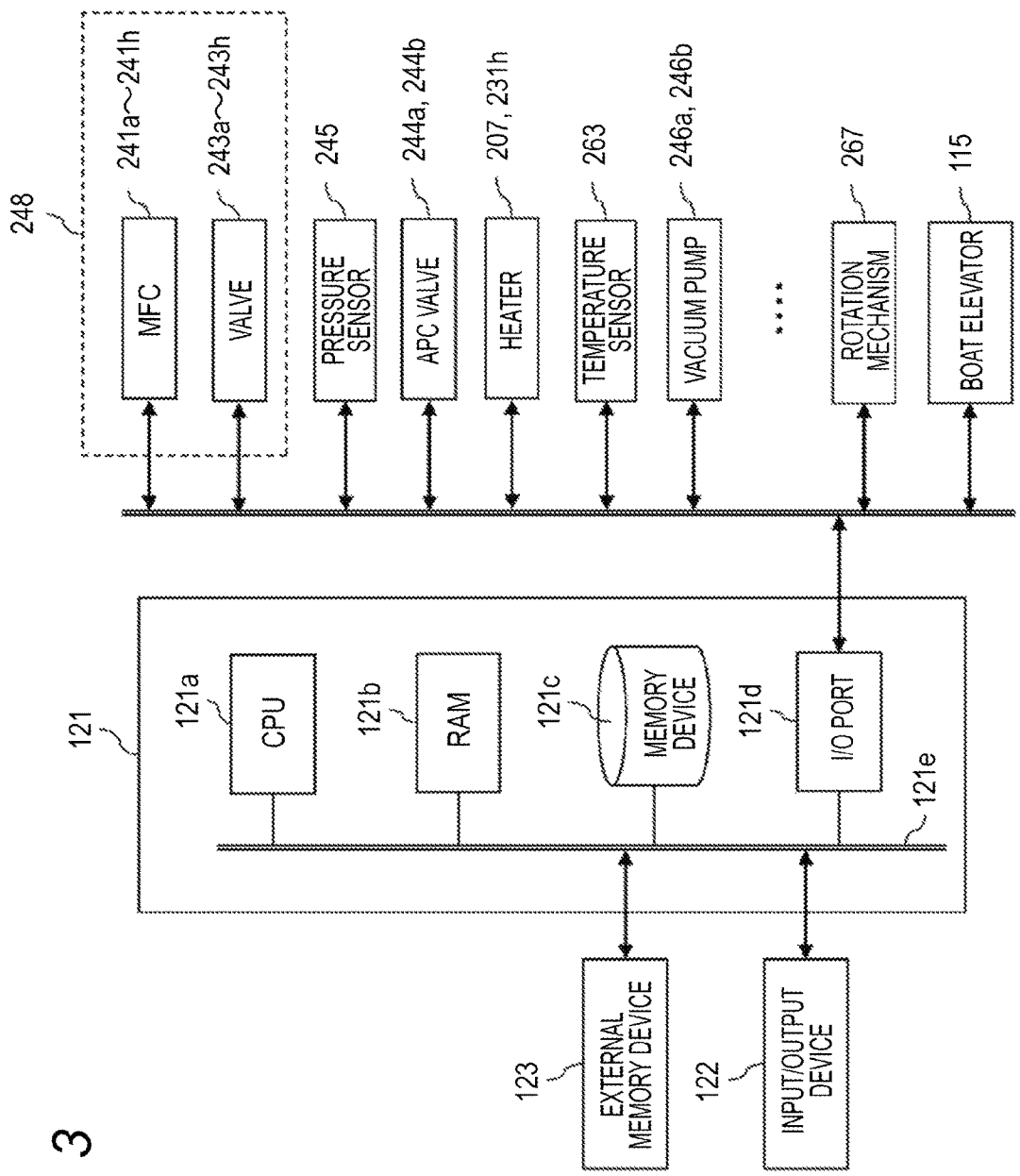
FIG. 3 is a schematic configuration diagram of a controller of the substrate processing apparatus suitably used in the embodiment of the present invention and a block diagram of a control system of the controller.

As illustrated in FIG. 3, a controller 121 being a control unit (control means) is configured by a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122, which is configured as, for example, a touch panel or the like, is connected to the controller 121.

The memory device 121c is configured by, for example, a flash memory, a hard disk drive (HDD), or the like. In the memory device 121c, a control program for controlling an operation of a substrate processing apparatus or a process recipe including procedures or conditions of substrate processing described later is stored to be readable. The process recipe is a combination of procedures of a substrate processing process described later so as to obtain a desired result when the procedures are performed by the controller 121, and functions as a program. Hereinafter, the process recipe, the control program, and the like will be simply and collectively referred to as a program. In addition, the process recipe is simply referred to as a recipe. When the term "program" is used in the present specification, it may be understood as including only a recipe alone, only a control program alone, or both of the recipe and the control program. The RAM 121b is configured as a memory area (work area) in which a program or data read by the CPU 121a is temporarily retained.

The I/O port 121d is connected to the MFCs 241a to 241h, the valves 243a to 243h, the pressure sensor 245, the APC valves 244a and 244b, the vacuum pumps 246a and 246b, the heaters 207 and 231h, the temperature sensor 263, the rotation mechanism 267, the boat elevator 115, and the like.

The CPU 121a is configured to read and execute the control program from the memory device 121c and to read the recipe from the memory device 121c according to an input of an operation command from the I/O device 122, or the like. According to the contents of the read recipe, the CPU 121a is configured to control the operation of adjusting the flow rates of various gases by using the MFCs 241a to 241h, the operation of opening and closing the valves 243a to 243h, the operation of opening and closing the APC valves 244a and 244b, the operation of adjusting the pressure by using the APC valves 244a and 244b based on the pressure sensor 245, the start and stop of the vacuum pumps 246a and 246b, the operation of adjusting the temperature of the heater 207 based on the temperature sensor 263, the operation of adjusting the temperature of the heater 231h, the operation of adjusting the rotation and the rotating speed of the boat 217 by using the rotation mechanism 267, and the operation of moving the boat 217 upward and downward by using the boat elevator 115.

The controller 121 can be configured by installing, on a computer, the program stored in an external memory device (for example, a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a non-transitory computer-readable recording medium. Hereinafter, the memory device 121c and the external memory device 123 may also be simply and collectively referred to as a recording medium. When the term "recording medium" is used in the present specification, it may be understood as including only the memory device 121c alone, only the external memory device 123 alone, or both of the memory device 121c and the external memory device 123. The provision of the program to the computer may be performed by using a communication means, such as the Internet, dedicated lines, or the like, without using the external memory device 123.

(2) Substrate Processing Process

As one of the processes of manufacturing a semiconductor device, an example of a sequence of forming a silicon nitride film (SiN film) on a wafer 200 as a substrate by using the above-described substrate processing apparatus will be described with reference to FIGS. 4 and 5. In FIG. 5, ○ indicates the opened states of the APC valves 244a and 244b, and ● indicates the closed states of the APC valves 244a and 244b. In addition, the illustration of the $N_2$ gas flowing through each exhaust system is partially omitted in FIGS. 4 and 5 for convenience. In the following description, operations of the respective elements constituting the substrate processing apparatus are controlled by the controller 121.

Figure 4:
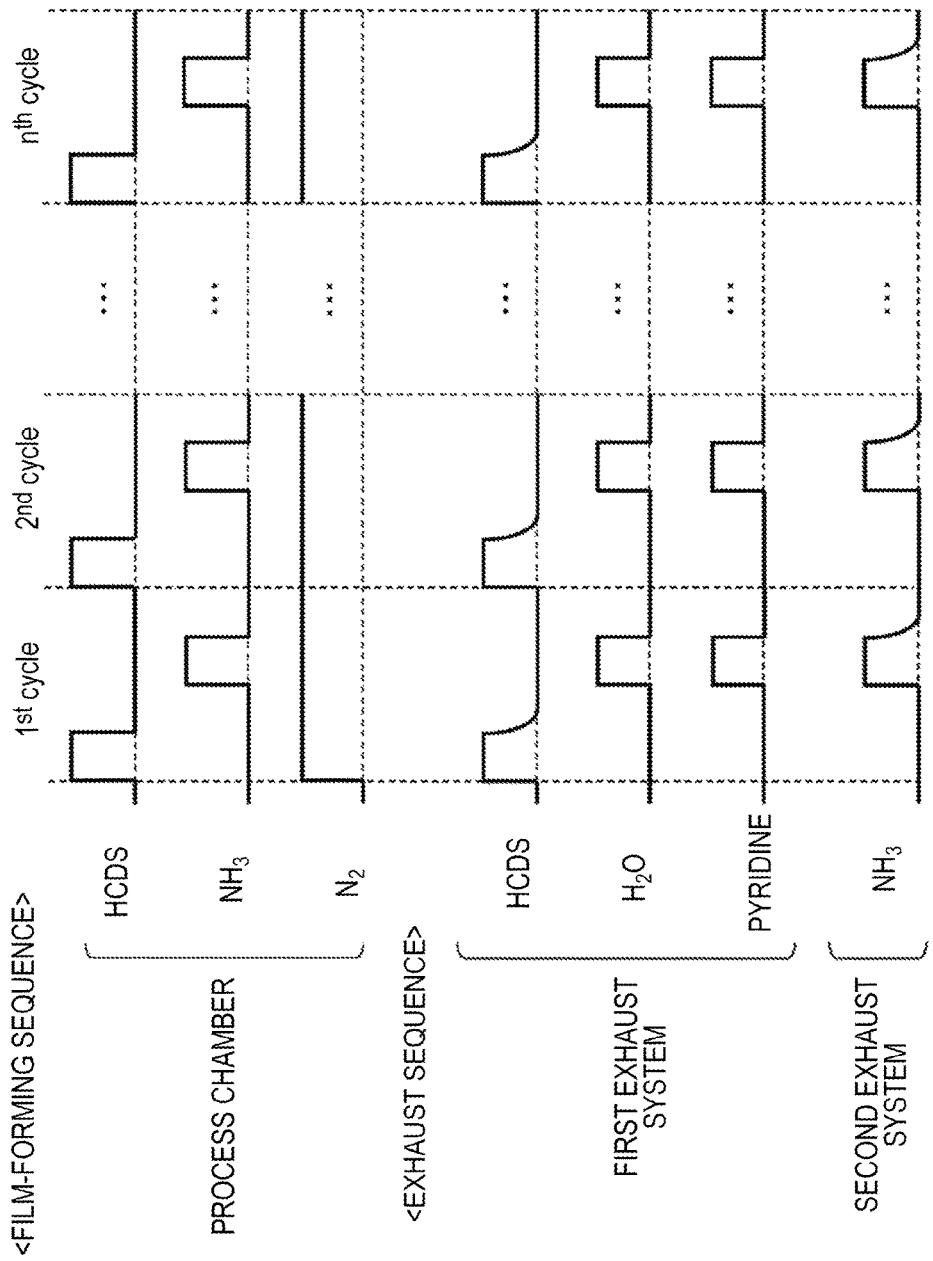
FIG. 4 is a sequence diagram illustrating a flow of gas in a process chamber and an exhaust system according to an embodiment of the present invention.
Figure 5:
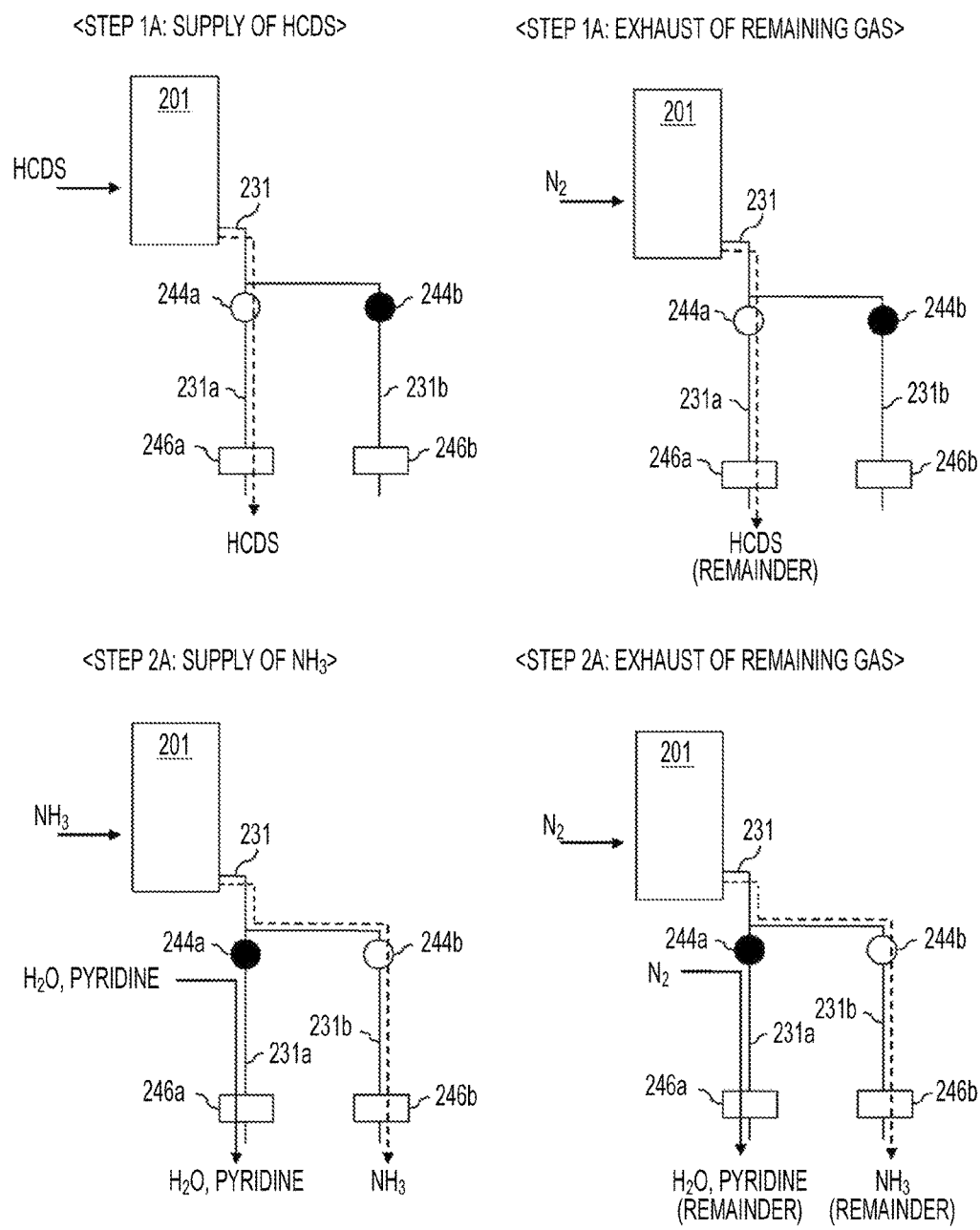
FIG. 5 is a diagram illustrating an operation of an exhaust system according to an embodiment of the present invention.

In the film-forming sequence illustrated in FIG. 4, the SiN film is formed on the wafer 200 by performing a cycle a predetermined number of times, the cycle including: a step 1A of supplying an HCDS gas to the wafer 200 in the process chamber 201 and exhausting the HCDS gas from the first exhaust system; and a step 2A of supplying an $NH_3$ gas to the wafer 200 in the process chamber 201 and exhausting the $NH_3$ gas from the second exhaust system. In addition, in the film-forming sequence, when the HCDS gas does not flow through the first exhaust system, an $H_2O$ gas and a pyridine gas are directly supplied from the supply ports 261a and 262a, which are provided in the first exhaust system, into the first exhaust system.

In the present specification, for convenience, the film-forming sequence illustrated in FIG. 4 may be represented as follows. In the following descriptions of modification examples or the like, the same notation is used.

(HCDS→$NH_3$)×n=>SiN

When the term "wafer" is used in the present specification, it may be understood as a wafer itself or a laminate of a wafer and a predetermined layer or film formed on a surface thereof. When the expression "a surface of a wafer" is used in the present specification, it may be understood as "a surface of a wafer itself" or "a surface of a predetermined layer or the like formed on a wafer." When the expression "a predetermined layer is formed on a wafer" is used in the present specification, it may be understood to mean that "a predetermined layer is directly formed on a surface of a wafer itself" or mean that "a predetermined layer is formed on a layer or the like formed on a wafer." A case where the term "substrate" is used in the present specification is synonymous with the case where the term "wafer" is used.

(Wafer Charging and Boat Loading)

A plurality of wafers 200 are charged into the boat 217 (wafer charging). After that, as illustrated in FIG. 1, the boat 217 that supports the plurality of sheets of wafers 200 is lifted by the boat elevator 115 and is loaded into the process chamber 201 (boat loading). In this state, the seal cap 219 is in a state of sealing the lower end of the reaction tube 203 through the O-ring 220.

(Pressure Adjustment and Temperature Adjustment)

The inside of the process chamber 201, that is, the space where the wafers 200 are present, is vacuum-exhausted (exhausted under reduced pressure) to have a desired pressure (degree of vacuum) by the first exhaust system and the second exhaust system. In this case, the pressure in the process chamber 201 is measured by the pressure sensor 245, and the APC valves 244a and 244b are feedback-controlled based on information about the measured pressure. The vacuum pumps 246a and 246b maintain a full-time operating state at least until the processing on the wafers 200 is completed.

In addition, the wafers 200 in the process chamber 201 are heated by the heater 207 so that the wafers 200 have a predetermined temperature (film-forming temperature). In this case, an amount of current supplied to the heater 207 is feedback-controlled based on the temperature information detected by the temperature sensor 263, so that the inside of the process chamber 201 has a predetermined temperature distribution. In addition, the inside of the exhaust pipe 231 and the insides of the exhaust pipes 231a and 231b on the upstream side of the APC valves 244a and 244b are heated by the heater 231h so that they have a predetermined temperature (temperature capable of suppressing adsorption of the precursor). The heating by the heaters 207 and 231h is continuously performed at least until the processing on the wafers 200 is completed.

In addition, the rotation of the boat 217 and the wafers 200 is started by the rotation mechanism 267. The rotation of the boat 217 and the wafers 200 is continuously performed at least until the processing on the wafers 200 is completed.

(Film-Forming Step)

After that, the following steps 1A and 2A are sequentially performed.

[Step 1A]

In this step, an HCDS gas is supplied to the wafers 200. Specifically, as illustrated in the upper left of FIG. 5, in a state in which the APC valve 244b is fully closed and the APC valve 244a is opened, the valve 243a is opened to supply the HCDS gas into the gas supply pipe 232a. The HCDS gas, the flow rate of which is controlled by the MFC 241a, is supplied into the process chamber 201 through the nozzle 249a and is exhausted from the exhaust pipe 231a, that is, the first exhaust system, through the exhaust pipe 231. At this time, the HCDS gas is supplied to the wafer 200. At this time, the valve 243c is opened at the same time so that an $N_2$ gas flows into the gas supply pipe 232c. The $N_2$ gas is supplied into the process chamber 201 together with the HCDS gas and is exhausted from the exhaust pipe 231a. In addition, in order to prevent the intrusion of the HCDS gas into the nozzle 249b, the valve 243d is opened so that the $N_2$ gas flows into the gas supply pipe 232d. The $N_2$ gas is supplied into the process chamber 201 through the gas supply pipe 232b and the nozzle 249b and is exhausted from the exhaust pipe 231a.

By supplying the HCDS gas to the wafer 200, a Si-containing layer including Cl is formed on an outermost surface of the wafer 200. The Si-containing layer including Cl may be a Si layer including Cl, may be an adsorption layer of the HCDS, or may include both of them. Hereinafter, the Si-containing layer including Cl is simply referred to as a Si-containing layer.

After the Si-containing layer is formed on the wafer 200, the valve 243a is closed to stop the supply of the HCDS gas. At this time, as illustrated in the upper right of FIG. 5, the open/close states of the APC valves 244a and 244b are maintained for a predetermined time in a state illustrated in the upper left of FIG. 5. In this manner, the HCDS gas remaining in the process chamber 201 is exhausted from the first exhaust system. At this time, the valves 243c and 243d are maintained in the opened state, and the supply of the $N_2$ gas into the process chamber 201 is maintained. The $N_2$ gas acts as a purge gas to accelerate the exhaust of the remaining gas (HCDS gas) from the process chamber 201, the exhaust pipe 231, and the exhaust pipe 231a.

However, even if the purging with the $N_2$ gas is performed as described above, a halogen-based material such as HCDS tends to remain in the reaction vessel or the exhaust system, as compared with the non-halogen-based material such as $NH_3$. In particular, in a low temperature region of the exhaust pipe 231a (downstream side of the APC valve 244a) that is not heated by the heaters 207 and 231h, HCDS is adhered (adsorbed, coagulated) to the inner wall thereof and tends to remain in an activated (unstable) state. HCDS remaining in the exhaust pipe 231a (hereinafter, also referred to as a remaining HCDS) may be slightly oxidized by a small amount of atmospheric air leakage in the reaction vessel or the exhaust system, but in any case, a powdery active material containing a large amount of Cl tends to be deposited on the inner wall of the exhaust pipe 231a.

[Step 2A]

After step 1A is completed, an $NH_3$ gas is supplied to the wafer 200. In this step, as illustrated in the lower left of FIG. 5, in a state in which the APC valve 244a is fully closed and the APC valve 244b is opened, the opening and closing control of the valves 243b to 243d is performed in the same sequence as the opening and closing control of the valves 243a, 243c, and 243d in step 1A, so that the $NH_3$ gas flows into the gas supply pipe 232b. The $NH_3$ gas, the flow rate of which is controlled by the MFC 241b, is supplied into the process chamber 201 through the nozzle 249b and is exhausted from the exhaust pipe 231b, that is, the second exhaust system, through the exhaust pipe 231. At this time, the $NH_3$ gas is supplied to the wafer 200.

By supplying the $NH_3$ gas to the wafer 200, at least a portion of a Si-containing layer formed on the wafer 200 can be reformed (nitridation). Due to this, a layer including Si and N, that is, a silicon nitride layer (SiN layer), is formed on the wafer 200. When the SiN layer is formed, impurities such as Cl included in the Si-containing layer are separated from the layer in the process of the reforming reaction, constitute a gaseous material including at least Cl, and are exhausted from the process chamber 201. Therefore, the SiN layer is a layer that has less impurities such as Cl, as compared with the Si-containing layer.

After the SiN layer is formed on the wafer 200, the valve 243b is closed to stop the supply of the $NH_3$ gas. At this time, as illustrated in the lower right of FIG. 5, the open/close states of the APC valves 244a and 244b are maintained for a predetermined time in a state illustrated in the lower left of FIG. 5. In this manner, the $NH_3$ gas remaining in the process chamber 201 is exhausted from the second exhaust system. At this time, the valves 243c and 243d are kept open to accelerate the exhaust of the remaining gas ($NH_3$ gas) from the process chamber 201, the exhaust pipe 231, and the exhaust pipe 231b.

When step 2A is performed (when the $NH_3$ gas is exhausted from the second exhaust system), that is, when the HCDS gas does not flow through the first exhaust system, the valves 243e and 243f are opened so that an $H_2O$ gas and a pyridine gas are directly supplied into the first exhaust system, as illustrated in the lower left of FIG. 5. The $H_2O$ gas and the pyridine gas, the flow rates of which are respectively controlled by the MFCs 241e and 241f, are supplied into the exhaust pipe 231a from the supply ports 261a and 262a, are mixed with each other, and are exhausted by the vacuum pump 246a. At this time, the APC valve 244a is in a fully closed state, and the inside of the first exhaust system and the inside of the process chamber 201 do not communicate with each other.

By directly supplying the $H_2O$ gas into the exhaust pipe 231a, the HCDS remaining in the exhaust pipe 231a is oxidized (reformed). Due to the reforming of the remaining HCDS, a dense and rigid film including Si and O, that is, a silicon oxide film (SiO film), is formed on the inner wall of the exhaust pipe 231a, or the like.

In the above-described reaction system, the pyridine gas acts as a catalyst that weakens the binding force of the O—H bond which the $H_2O$ gas has, accelerates the decomposition of the $H_2O$ gas, and accelerates the reaction between the $H_2O$ gas and the remaining HCDS. For example, the pyridine gas acts on the O—H bond which the $H_2O$ gas has and acts to weaken the binding force of the O—H bond. Due to the reaction between H having the weakened binding force and Cl of the remaining HCDS, a gaseous material including Cl and H, such as hydrochloric acid (HCl), is generated. At that time, H is desorbed from the $H_2O$ gas, and Cl is desorbed from the remaining HCDS. O of the $H_2O$ gas from which H is lost is bonded to Si of the remaining HCDS from which Cl is desorbed. Due to the catalytic action, the above-described oxidation can be efficiently performed even under a low temperature condition in the exhaust pipe 231a that is not heated by the heater 231h. Since Cl is desorbed from the remaining HCDS, the SiO film formed in the exhaust pipe 231a is a stable film having a very small content of Cl.

Due to the catalytic action of the pyridine gas, the binding force of the O—H bond which the $H_2O$ gas has is weakened because N having a lone electron pair in the pyridine molecule acts to attract H. A compound having large acid dissociation constant (pKa) has a strong H-attracting force. When a compound having pKa of 5 or more is used as a catalyst, the compound can appropriately weaken the binding force of the O—H bond which the $H_2O$ gas has and can accelerate the above-described oxidation reaction. However, when a compound having excessively large pKa is used as a catalyst, Cl released from the remaining HCDS reacts with the catalyst. Thus, a salt such as ammonium chloride ($NH_4Cl$) may be generated. Therefore, a compound having pKa of, for example, 11 or less, and preferably 7 or less, is suitably used as the catalyst. The pyridine has relatively large pKa of about 5.67, and the pyridine having pKa of 7 or less can be suitably used as the catalyst.

When the reforming of the remaining HCDS is completed, that is, when the forming of the SiO film on the inner wall of the exhaust pipe 231a or the like is completed, the valves 243e and 243f are closed to stop the supply of the $H_2O$ gas and the pyridine gas into the exhaust pipe 231a, and this state is maintained for a predetermined time. Due to this, the $H_2O$ gas and the pyridine gas remaining in the exhaust pipe 231a are exhausted from the exhaust pipe 231a. In addition, at this time, the valves 243g and 243h are opened and the $N_2$ gas is directly supplied into the exhaust pipe 231a as illustrated in the lower right of FIG. 5. The $N_2$ gas acts as a purge gas to accelerate the exhaust of the remaining gas ($H_2O$ gas, pyridine gas) from the exhaust pipe 231a. By exhausting the $H_2O$ gas and the pyridine gas from the exhaust pipe 231a until step 2A is completed, it is possible to suppress a gas phase reaction between the HCDS and the remaining $H_2O$ gas in the exhaust pipe 231a in the following step 1A.

[Performing Predetermined Number of Times]

A cycle of alternately performing steps 1A and 2A is performed a predetermined number of times (n times (where n is an integer equal to or greater than 1)), and thus, the HCDS gas and the $NH_3$ gas flow into the process chamber 201 intermittently and non-simultaneously a predetermined number of times. Due to this, the SiN film having a predetermined film thickness can be formed on the wafer 200. The above-described cycle is preferably performed twice or more.

In addition, by performing the above-described cycle, the HCDS gas, the $H_2O$ gas, and the pyridine gas flow into the first exhaust system (exhaust pipe 231a) intermittently and alternately (non-simultaneously) a predetermined number of times as illustrated in FIG. 4. Due to this, the remaining HCDS, $H_2O$ gas, and pyridine gas intermittently react with one another in the exhaust pipe 231a, and the SiO film is laminated on the inner wall of the exhaust pipe 231a. The laminated film is a film that has a small content of Cl, is stable, and is so dense and rigid as to be difficult to peel off.

An example of the processing condition (inside the process chamber) of step 1A is as follows: the supply flow rate of the HCDS gas: 100 sccm to 2,000 sccm, and preferably 10 sccm to 1,000 sccm, the supply time of the HCDS gas: 1 second to 120 seconds, and preferably 1 second to 60 seconds, the supply flow rate of the $N_2$ gas (for each gas supply pipe): 10 sccm to 10,000 sccm, the film-forming temperature: 250° C. to 800° C., and preferably 400° C. to 700° C., and the film-forming pressure: 1 Pa to 2,666 Pa, and preferably 67 Pa to 1,333 Pa.

An example of the processing condition (inside the exhaust system) of step 1A is as follows: the temperature of the exhaust pipe (upstream side of the APC valve): 150° C. to 200° C., the temperature of the exhaust pipe (downstream side of the APC valve): 10° C. to 90° C., and preferably room temperature (25° C.) to 70° C., and the pressure in the exhaust pipe 231a: 1 Pa to 2,666 Pa, and preferably 67 Pa to 1,333 Pa.

An example of the processing condition (inside the process chamber) of step 2A is as follows: the supply flow rate of the $NH_3$ gas: 1 sccm to 4,000 sccm, and preferably 1 sccm to 3,000 sccm, the supply time of the $NH_3$ gas: 1 second to 120 seconds, and preferably 1 second to 60 seconds, the supply flow rate of the $N_2$ gas (for each gas supply pipe): 10 sccm to 10,000 sccm, the film-forming temperature: the same temperature condition as that in step 1A, and the film-forming pressure: 1 Pa to 4,000 Pa, and preferably 1 Pa to 3,000 Pa.

In addition, an example of the processing condition (inside the exhaust system) of step 2A is as follows: the supply flow rate of the $H_2O$ gas: 100 sccm to 2,000 sccm, and preferably 10 sccm to 1,000 sccm, the supply time of the $H_2O$ gas: 1 second to 120 seconds, and preferably 1 second to 60 seconds, the supply flow rate of the pyridine gas: 100 sccm to 2,000 sccm, and preferably 10 sccm to 1,000 sccm, the supply time of the pyridine gas: 1 second to 120 seconds, and preferably 1 second to 60 seconds, the supply flow rate of the $N_2$ gas (for each gas supply pipe): 10 sccm to 10,000 sccm, the temperature of the exhaust pipe (upstream side of the APC valve): the same temperature condition as that in step 1A, the temperature of the exhaust pipe (downstream side of the APC valve): the same temperature condition as that in step 1A, and the pressure in the exhaust pipe 231a: 1 Pa to 2,666 Pa, and preferably 67 Pa to 1,333 Pa.

As the precursor, in addition to the HCDS gas, a chlorosilane precursor gas containing a Si—Cl bond, such as monochlorosilane ($SiH_3Cl$, abbreviated to MCS) gas, dichlorosilane ($SiH_2Cl_2$, abbreviated to DCS) gas, trichlorosilane ($SiHCl_3$, abbreviated to TCS) gas, tetrachlorosilane ($SiCl_4$, abbreviated to STC) gas, octachlorotrisilane ($Si_3Cl_8$, abbreviated to OCTS) gas, or the like, can be used.

As the reactant, in addition to the $NH_3$ gas, a hydrogen nitride-based gas containing an N—H bond, such as a diazene ($N_2H_2$) gas, a hydrazine ($N_2H_4$) gas, an $N_3H_8$ gas, or the like, can be used.

As the oxidizing agent, in addition to the $H_2O$ gas, an O-containing gas containing an O—H bond, such as hydrogen peroxide ($H_2O_2$) gas or the like, or an O-containing gas not containing an O—H bond and containing an O—O bond, such as an oxygen ($O_2$) gas, an ozone ($O_3$) gas, hydrogen ($H_2$) gas+$O_2$ gas, $H_2$ gas+$O_3$ gas, or the like, can be used.

As the catalyst, in addition to the pyridine gas, a cyclic amine-based gas, such as an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas, a piperidine ($C_5H_{11}N$, pKa=11.12) gas, or the like, a chain amine-based gas, such as a triethylamine (($C_2H_5)_3N$, abbreviated to TEA, pKa=10.7) gas, a diethylamine (($C_2H_5)_2NH$, abbreviated to DEA, pKa=10.9) gas, a monoethylamine (($C_2H_5)NH_2$, abbreviated to MEA, pKa=10.6) gas, a trimethylamine (($CH_3)_3N$, abbreviated to TMA, pKa=9.8) gas, a dimethylamine ($(CH_3)_2NH$, abbreviated to DMA, pKa=10.8) gas, a monomethylamine (($CH_3$)$NH_2$, abbreviated to MMA, pKa=10.6) gas, or the like, or a non-amine-based gas, such as an $NH_3$ gas or the like, can be used.

As the inert gas, in addition to the $N_2$ gas, a rare gas, such as an Ar gas, a He gas, a Ne gas, a Xe gas, or the like, can be used.

(After-Purge and Atmospheric Pressure Returning)

When the forming of the SiN film on the wafer 200 is completed, an $N_2$ gas is supplied from each of the gas supply pipes 232c and 232d into the process chamber 201, and the inside of the process chamber 201 is vacuum-exhausted from the first exhaust system and the second exhaust system. Therefore, the inside of the process chamber 201 is purged with the $N_2$ gas so that the reaction by-product or the gas remaining in the process chamber 201 is removed from the process chamber 201 (after-purge). After that, the atmosphere in the process chamber 201 is replaced with the inert gas (inert gas replacement) and the pressure in the process chamber 201 is returned to the atmospheric pressure (atmospheric pressure returning).

(Boat Unloading and Wafer Discharging)

The seal cap 219 is moved downward by the boat elevator 115 to open the lower end of the reaction tube 203. After that, the processed wafer 200 is unloaded from the lower end of the reaction tube 203 to the outside of the reaction tube 203 in a state of being supported to the boat 217 (boat unloading). The processed wafer 200 is discharged from the boat 217 (wafer discharging).

(3) Effects of Present Embodiment

According to the present embodiment, one or more effects described below can be obtained.

(a) When the HCDS gas does not flow through the first exhaust system, the remaining HCDS adhered to the inner wall of the exhaust pipe 231a or the like can be oxidized and deactivated by directly supplying the $H_2O$ gas and the pyridine gas into the first exhaust system. The SiO film formed by this reaction is a stable and dense film, is difficult to peel off from the inner wall of the exhaust pipe 231a, and does not damage the vacuum pump 246a. As a result, it is possible to reduce the maintenance frequency of the exhaust system and prolong the lifespan of the vacuum pump 246a.

(b) Since the SiO film formed by the above-described oxidation reaction is a deactivated film containing a small content of Cl, a harmful gas such as an HCl gas or a chlorine (Cl$_2$) gas is not easily generated even if the SiO film is exposed to the atmosphere. As a result, it is possible to enhance safety during the maintenance work of the exhaust system. In addition, since the inside of the exhaust system need not be purged for along time before the maintenance work, it is possible to reduce the downtime of the substrate processing apparatus. In a case where the oxidation treatment of the remaining HCDS in the exhaust pipe 231a is not performed, it is necessary to perform a preparatory work, such as purging with the NH$_3$ gas in the exhaust pipe 231a, for example, for 24 hours or more, and purging with the N$_2$ gas, for example, for 48 hours or more, before the maintenance work. If this preparatory work is not performed, when the inside of the exhaust pipe 231a is exposed to the atmosphere, a harmful gas is generated from a deposited material containing a large amount of Cl in the exhaust pipe 231a. Thus, in some cases, the deposited material may ignite and the safety of work may be threatened.

(c) When the H$_2$O gas is directly supplied into the first exhaust system, the pyridine gas is supplied together with the H$_2$O gas. Thus, even when the temperature in the exhaust pipe 231a is set to the above-described low temperature condition, it is possible to reliably oxidize the remaining HCDS. That is, according to the present embodiment, it is unnecessary to wind the heater 231h around the outer periphery of the exhaust pipe 231a arranged over a long distance of, for example, several tens of meters or more, and it is possible to reduce installation cost or operation cost of the substrate processing apparatus. Even when the downstream side of the APC valve 244a is heated, it is difficult to heat a joint part or the like including an O-ring having a low heat resistance to a temperature of 200° C. or more. In such a low temperature part (heating defect part), the adhered amount of the HCDS tends to locally increase. According to the present embodiment, it is possible to avoid these problems.

(d) Since the exhaust pipe 231a is not heated by the heater 231h or the like, it is possible to suppress the peeling of the deposited material (SiO film) adhered to the inner wall of the exhaust pipe 231a due to the thermal expansion and thermal contraction of the exhaust pipe 231a. As a result, it is possible to reduce the maintenance frequency of the exhaust system and prolong the lifespan of the vacuum pump 246a.

(e) Since the first exhaust system is used when the HCDS gas is exhausted from the process chamber 201 and the second exhaust system is used when the NH$_3$ gas is exhausted from the process chamber 201, it is possible to avoid the mixing or reaction between the HCDS gas and the NH$_3$ gas in the insides thereof. Therefore, it is possible to suppress the generation of NH$_4$Cl or the like in the exhaust pipes 231a and 231b or the generation of particles including NH$_4$Cl or the like. As a result, it is possible to reduce the maintenance frequency of the exhaust system and prolong the lifespan of the vacuum pumps 246a and 246b.

(f) The same effects as described above can also be obtained even when a halogen-based precursor gas except for the HCDS gas is used as the precursor, even when a hydrogen nitride-based gas except for the NH$_3$ gas or other reactant gases are used as the reactant, even when an O-containing gas except for the H$_2$O gas is used as the oxidizing agent, or even when an amine-based gas except for pyridine or a non-amine-based gas is used as the catalyst.

(4) Modification Examples

The film-forming sequence according to the present embodiment is not limited to the above-described aspects and can be modified into the following modification examples.

Modification Example 1

In step 1A, the pyridine gas may be directly supplied into the first exhaust system, that is, the exhaust pipe 231a through which the HCDS gas flows. The pyridine gas acts as a catalyst that accelerates the breaking of the Si—Cl bond in the HCDS gas flowing through the exhaust pipe 231a and accelerates the adsorption of the HCDS on the inner wall of the exhaust pipe 231a. By adsorbing the HCDS on the inner wall of the exhaust pipe 231a, it is possible to reduce the amount of the HCDS gas reaching the vacuum pump 246a. As a result, by using the exhaust pipe 231a as an HCDS trap mechanism, it is possible to reduce the maintenance frequency of the vacuum pump 246a and prolong the lifespan of the vacuum pump 246a.

Modification Example 2

In step 2A, a plasma-excited O$_2$ gas (O$_2$*) may be used as a deactivator. That is, the O$_2$* may be directly supplied into the exhaust pipe 231a, instead of supplying the H$_2$O gas and the pyridine gas. However, since the lifespan of O$_2$* as the active species is limited, it may be difficult to progress the above-described oxidation treatment throughout the exhaust pipe 231a according to the length or structure of the exhaust pipe 231a. To directly supply the H$_2$O gas into the exhaust pipe 231a together with the pyridine gas is preferable because it is easy to progress the above-described oxidation treatment throughout the exhaust pipe 231a, regardless of the length or structure of the exhaust pipe 231a.

Other Embodiments of Present Invention

In the above-described embodiment, the case where the pressure sensor 245 is provided in the exhaust pipe 231 has been described, but the present invention is not limited to such an aspect. For example, the pressure sensor may be provided in each of the exhaust pipes 231a and 231b. That is, the pressure sensor may be provided in each of the APC valves 244a and 244b.

In addition, in the above-described embodiment, the case where the APC valves 244a and 244b are respectively provided in the exhaust pipes 231a and 231b has been described, but the present invention is not limited to such an aspect. For example, only one APC valve may be provided in the exhaust pipe 231. In this case, instead of the APC valves 244a and 244b, on-off valves serving as switching valves may be respectively provided in the exhaust pipes 231a and 231b. In addition, as the switching valve, a three-way valve may be provided at a portion where the exhaust pipe 231 is branched.

Figure 6:
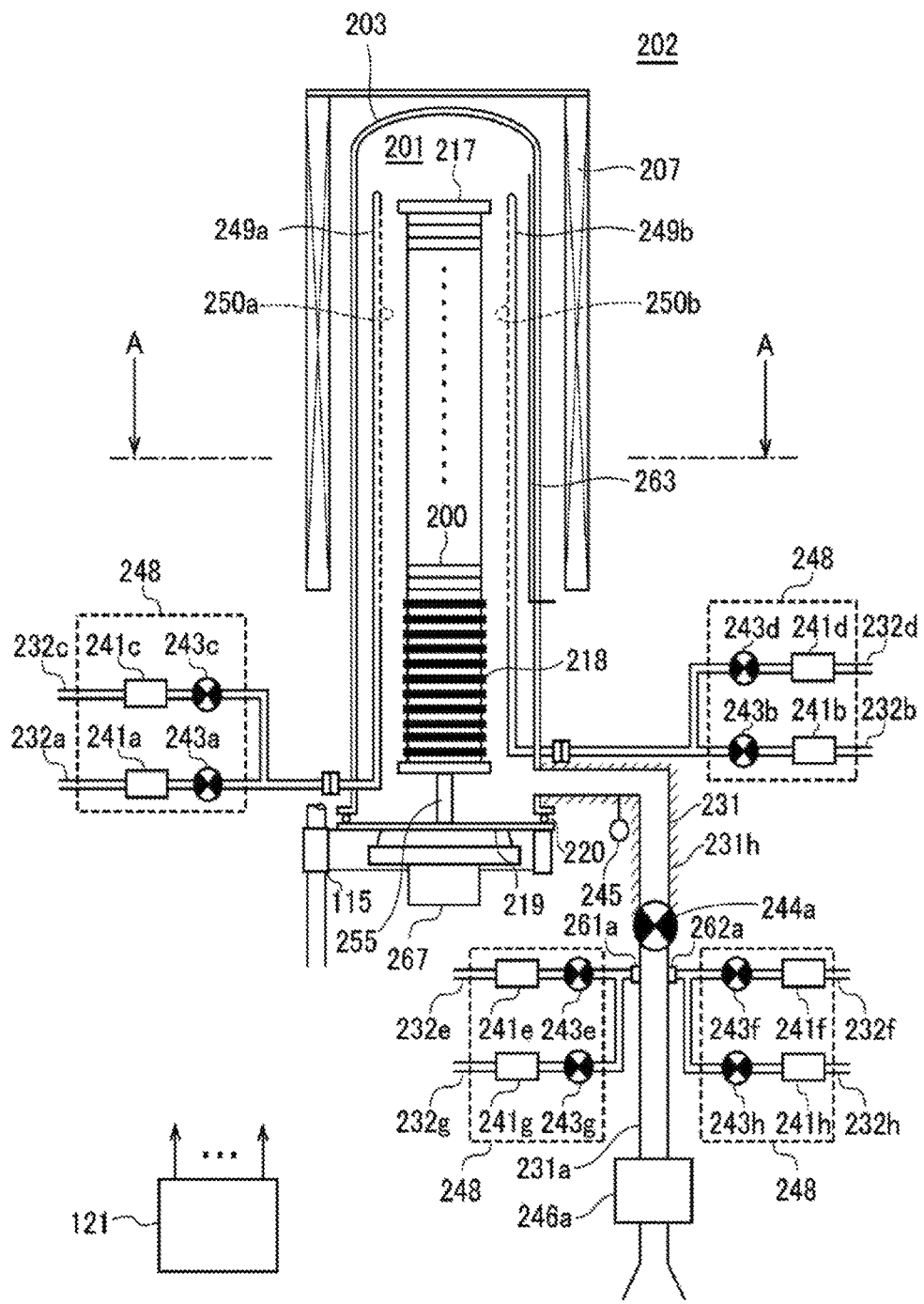
FIG. 6 is a schematic configuration diagram of a vertical process furnace of a substrate processing apparatus suitably used in another embodiment of the present invention and a longitudinal sectional view of a process furnace part.

In addition, in the above-described embodiment, the case where the first exhaust system and the second exhaust system are configured as different exhaust systems has been described, but the present invention is not limited to such an aspect. For example, as illustrated in FIG. 6, the first exhaust system and the second exhaust system may be configured as the same exhaust system, without branching the downstream side of the exhaust pipe 231 (without providing the exhaust pipe 231b, the APC valve 244b, the vacuum pump 246b, and the like). That is, the exhaust of the precursor and the exhaust of the reactant may be performed by using the same exhaust system. In this case, for example, after the HCDS gas is exhausted from the same exhaust system, it is only necessary to supply the H$_2$O gas and the pyridine gas into the exhaust system before the exhaust of the NH$_3$ gas from the exhaust system is started. Hereinafter, the film-forming step performed by using the substrate processing apparatus illustrated in FIG. 6 will be described with reference to FIGS. 7 and 8. In the film-forming step, the following steps 1B and 2B are sequentially performed.

[Step 1B]

Figure 7:
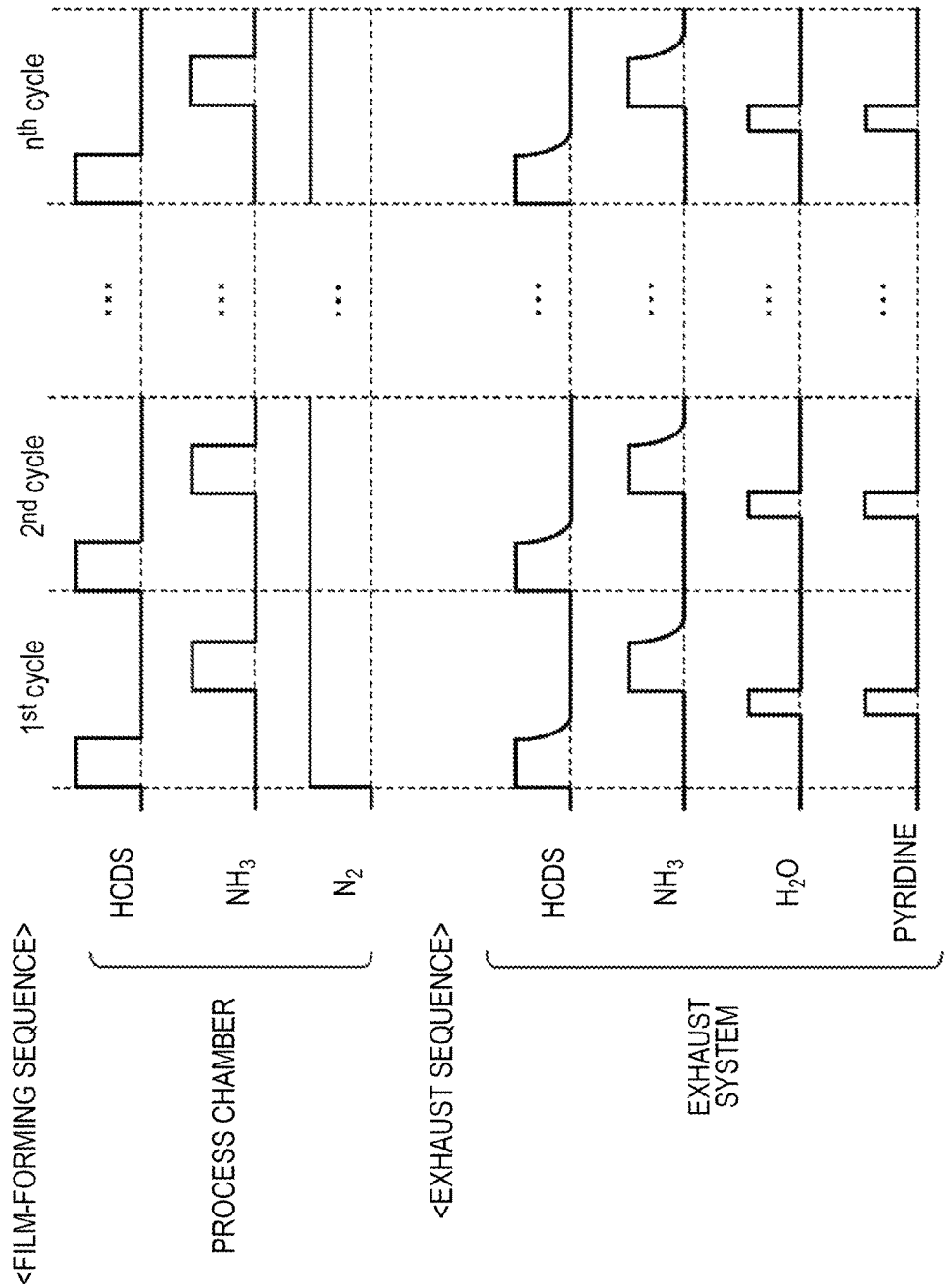
FIG. 7 is a sequence diagram illustrating a flow of gas in a process chamber and an exhaust system according to another embodiment of the present invention.

As illustrated in FIG. 7, in this step, the HCDS gas is supplied to the wafer 200 in the process chamber 201 in the same processing procedure and processing condition as those in step 1A of the above-described embodiment. In this case, as illustrated in the upper left of FIG. 8, the HCDS gas supplied into the process chamber 201 is exhausted from the exhaust pipe 231*a*.

After the Si-containing layer is formed on the wafer 200, the supply of the HCDS gas into the process chamber 201 is stopped. Then, as illustrated in the upper right (first-half operation) of FIG. 8, the remaining gas (HCDS gas) is exhausted from the process chamber 201, the exhaust pipe 231, and the exhaust pipe 231*a*, while maintaining the supply of the N$_2$ gas into the process chamber 201.

After the HCDS gas is exhausted from the process chamber 201, the exhaust pipe 231, and the exhaust pipe 231*a*, that is, when the HCDS gas does not flow through the exhaust pipe 231*a*, the valves 243*e* and 243*f* are opened so that the H$_2$O gas and the pyridine gas are directly supplied into the exhaust pipe 231*a*, as illustrated in the upper right (second-half operation) of FIG. 8. In this manner, the remaining HCDS adhered on the inner wall of the exhaust pipe 231*a* is deactivated (oxidized), and thus, a dense and stable SiO film can be formed on the inner wall of the exhaust pipe 231*a*. The processing condition in the exhaust system at this time can be the same as the processing condition in the exhaust system in step 1A described above.

[Step 2B]

When the reforming of the remaining HCDS is completed, that is, when the forming of the SiO film on the exhaust pipe 231*a* is completed, the valves 243*e* and 243*f* are closed to stop the supply of the H$_2$O gas and the pyridine gas into the exhaust pipe 231*a*. After that, the NH$_3$ gas is supplied to the wafer 200 in the process chamber 201 in the same processing procedure and processing condition as those in step 2A. In this case, as illustrated in the lower left of FIG. 8, the NH$_3$ gas supplied into the process chamber 201 and the gas (H$_2$O gas, pyridine gas) remaining in the process chamber 201 and the exhaust pipe 231 are exhausted from the exhaust pipe 231*a*. The processing condition in the exhaust system at this time can be the same as the processing condition in the exhaust system in step 2A described above.

After the SiN layer is formed on the wafer 200, the supply of the NH$_3$ gas into the process chamber 201 is stopped. Then, as illustrated in the lower right of FIG. 8, the supply of the N$_2$ gas into the process chamber 201 is maintained for a predetermined time, and the remaining gas (mainly, the NH$_3$ gas) is exhausted from the process chamber 201, the exhaust pipe 231, and the exhaust pipe 231*a*.

[Performing Predetermined Number of Times]

The SiN film having a predetermined film thickness can be formed on the wafer 200 by performing a cycle of alternately performing the above-described steps 1B and 2B a predetermined number of times (n times). By performing the above-described cycle the predetermined number of times, the HCDS gas, the H$_2$O gas, the pyridine gas, and the NH$_3$ gas flow into the exhaust pipe 231*a* intermittently and non-simultaneously in this order a predetermined number of times as illustrated in FIG. 7. Due to this, as in the above-described embodiment, the remaining HCDS, H$_2$O gas, and pyridine gas intermittently react with one another in the exhaust pipe 231*a*. As a result, a stable and dense SiO film containing a small content of Cl is laminated on the inner wall of the exhaust pipe 231*a*.

Even in the present embodiment, the same effects as those of the above-described embodiment can be obtained.

The supply of the H$_2$O gas and the pyridine gas into the exhaust pipe 231*a* may be performed in step 2B as well as step 1B. For example, the supply of the H$_2$O gas and the pyridine gas into the exhaust pipe 231*a* may be continuously performed from the start of step 2B to the stop of the supply of the NH$_3$ gas, without stopping at the end of step 1B. In this case, in a part of a performance period (first half) of step 2B, the NH$_3$ gas, the H$_2$O gas, and the pyridine gas flow into the exhaust pipe 231*a*. Even in this case, the same effects as those of the above-described embodiment can be obtained. In addition, since the processing condition in the exhaust system is set to the above-described low temperature condition, the NH$_3$ gas can act as the catalyst like the pyridine gas, and the oxidation of the remaining HCDS in the exhaust pipe 231*a* can be reliably progressed.

In addition, the supply of the H$_2$O gas and the pyridine gas into the exhaust pipe 231*a* may not be performed in step 1B and may be performed only in step 2B. For example, the supply of the H$_2$O gas and the pyridine gas into the exhaust pipe 231*a* may be performed only from the start to the end of the supply of the NH$_3$ gas in step 2B. Even in this case, the same effects as those of the above-described embodiment can be obtained. In addition, as described above, the NH$_3$ gas can act as the catalyst like the pyridine gas, and the oxidation of the remaining HCDS in the exhaust pipe 231*a* can be reliably progressed.

In addition, when the supply of the H$_2$O gas and the pyridine gas into the exhaust pipe 231*a* is performed only in step 1B, the H$_2$O gas and the pyridine gas remaining in the exhaust pipe 231*a* may be exhausted in advance before the start of step 2B. By stopping the supply of the H$_2$O gas and the pyridine gas into the exhaust pipe 231*a* before the start of step 2B and maintaining that state for a predetermined time, the N$_2$ gas exhausted from the process chamber 201 can purge the inside of the exhaust pipe 231*a* and can accelerate the exhaust of the H$_2$O gas and the pyridine gas from the exhaust pipe 231*a*. In this case, it is possible to avoid the NH$_3$ gas, the H$_2$O gas, and the pyridine gas from being mixed in the exhaust pipe 231*a*.

Other Embodiments of Present Invention

The embodiments of the present invention have been specifically described above. However, the present invention is not limited to the above-described embodiments, and various modifications can be made thereto without departing from the scope of the present invention.

For example, the present invention can also be suitably applied to a case where a silicon oxycarbonitride film (SiOCN film), a silicon oxycarbide film (SiOC film), a silicon oxynitride film (SiON film), a silicon carbonitride film (SiCN film), and the like are formed on the wafer 200. These films can be formed by the following film-forming sequence by using a carbon (C)-containing halogen-based precursor such as 1,1,2,2-tetrachloro-1,2-dimethyldisilane ((CH₃)₂Si₂Cl₄, abbreviated to TCDMDS) gas or the like, or a reactant such as a propylene (C₃H₆) gas, a TEA gas, an O₂ gas, or the like.

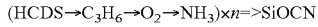

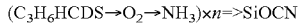

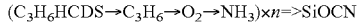

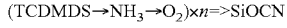

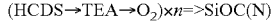

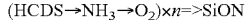

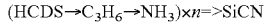

It is preferable that the recipe used in the substrate processing is individually prepared according to the contents of the processing and are stored in the memory device 121c through the telecommunication line or the external memory device 123. It is preferable that, when the processing is started, the CPU 121a appropriately selects a suitable recipe from the plurality of recipes stored in the memory device 121c according to the contents of the substrate processing. Therefore, films having various film types, composition ratios, film qualities, and film thicknesses can be formed with excellent reproducibility by using a single substrate processing apparatus. In addition, since the workload of an operator can be reduced, various processes can be promptly started while avoiding operation mistake.

The above-described recipe is not limited to the case of newly creating a process recipe. For example, the process recipe may be prepared by modifying an existing recipe having already been installed on the substrate processing apparatus. When the recipe is modified, the modified recipe may be installed on the substrate processing apparatus through the telecommunication line or the non-transitory computer-readable recording medium storing the corresponding recipe. In addition, the existing recipe having already been installed on the substrate processing apparatus may be directly modified by operating the I/O device 122 provided in the existing substrate processing apparatus.

In the above-described embodiments, the example of forming the film by using a batch-type substrate processing apparatus which processes a plurality of sheets of substrates at a time has been described. However, the present invention is not limited to the above-described embodiments. For example, the present invention can be suitably applied to the case of forming a film by using a single-wafer-type substrate processing apparatus which processes one substrate or several substrates at a time. In addition, in the above-described embodiments, the example of forming the film by using a substrate processing apparatus having a hot-wall-type processing furnace has been described. However, the present invention is not limited to the above-described embodiments. For example, the present invention can be preferably applied to the case of forming a film by using a substrate processing apparatus having a cold-wall-type processing furnace.

The respective embodiments or the respective modification examples can be appropriately combined. Moreover, the processing conditions at this time can be the same as, for example, the processing conditions of the above-described embodiments.

What is claimed is:

1. A method of manufacturing a semiconductor device comprising forming a film on a substrate by performing a cycle a predetermined number of times, the cycle including:
   supplying a precursor to the substrate in a process chamber and exhausting the precursor from a first exhaust system; and
   supplying a reactant to the substrate in the process chamber and exhausting the reactant from a second exhaust system,
   wherein, in the forming of the film, when the precursor does not flow through the first exhaust system, a deactivator that is a material different from the reactant is directly supplied from a supply port provided in the first exhaust system into the first exhaust system.

2. The method according to claim 1, wherein, in the forming of the film, the precursor and the deactivator alternately flow into the first exhaust system.

3. The method according to claim 1, wherein, in the forming of the film, the precursor attached to an inside of the first exhaust system and the deactivator intermittently react with each other.

4. The method according to claim 1, wherein the precursor comprises a halogen element, and
   in the forming of the film, the halogen element is extracted from the precursor attached to an inside of the first exhaust system by the deactivator.

5. The method according to claim 1, wherein, in the forming of the film, the precursor attached to an inside of the first exhaust system and the deactivator react with each other to form an oxide film on the inside of the first exhaust system.

6. The method according to claim 1, wherein the first exhaust system is an exhaust system different from the second exhaust system.

7. The method according to claim 6, wherein, when the reactant is exhausted from the second exhaust system, the deactivator is supplied into the first exhaust system.

8. The method according to claim 7, wherein, when the deactivator is supplied into the first exhaust system, an inside of the first exhaust system and an inside of the process chamber do not communicate with each other.

9. The method according to claim 1, wherein the first exhaust system is the same exhaust system as the second exhaust system.

10. The method according to claim 9, wherein, after the precursor is exhausted from the exhaust system, the deactivator is supplied into the exhaust system before the exhaust of the reactant from the exhaust system is started.

11. The method according to claim 9, wherein, when the reactant is exhausted from the exhaust system, the deactivator is supplied into the exhaust system.

12. The method according to claim 1, wherein the deactivator comprises an oxidizing agent and a catalyst.

13. The method according to claim 12, wherein the oxidizing agent contains an O—H bond.

14. The method according to claim 1, wherein, in the forming of the film, the act of supplying the precursor and exhausting the precursor from the first exhaust system and the act of supplying the reactant and exhausting the reactant from the second exhaust system are performed intermittently and non-simultaneously.

* * * * *